(12) United States Patent
Gallerano et al.

(10) Patent No.: US 7,859,804 B1
(45) Date of Patent: Dec. 28, 2010

(54) ESD PROTECTION STRUCTURE

(75) Inventors: Antonio Gallerano, Redwood City, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/836,705

(22) Filed: Aug. 9, 2007

(51) Int. Cl.
*H02H 9/00* (2006.01)
(52) U.S. Cl. .......................................... 361/56
(58) Field of Classification Search ............ 361/56
See application file for complete search history.

(56) References Cited

U.S. PATENT DOCUMENTS

2005/0286188 A1* 12/2005 Camp et al. ............... 361/56
2007/0236842 A1* 10/2007 Choi ......................... 361/56
2008/0123229 A1* 5/2008 Choi ......................... 361/56

* cited by examiner

*Primary Examiner*—Ronald W Leja
(74) *Attorney, Agent, or Firm*—Ward & Olivo LLP

(57) ABSTRACT

This relates to a sense circuit to detect an ESD event and turn on an SCR to discharge the ESD event. In a preferred embodiment, the circuit comprises a resistor in the signal path to/from an I/O buffer, a sense circuit in parallel with the resistor, an SCR connected between ground and a node between the resistor and the I/O pad, and an I/O buffer connected between ground and the other end of the resistor. When the sense circuit detects a significant voltage drop across the resistor, it injects current into the SCR, thereby turning on the SCR and discharging the ESD event.

18 Claims, 5 Drawing Sheets

ESD PROTECTION STRUCTURE

FIELD OF THE INVENTION

This relates to electrostatic discharge (ESD) protection structures for protecting an integrated circuit from ESD damage.

BACKGROUND OF THE INVENTION

ESD protection has been a main concern in the reliability of integrated circuit (IC) products in submicron complimentary metal-oxide-silicon (CMOS) technologies. For example, N-type metal metal-oxide-silicon (NMOS) and P-type metal-oxide-silicon (PMOS) transistors in input/output (I/O) buffers of a CMOS IC are often directly connected to input pads of the IC, causing the CMOS input buffers to be vulnerable to ESD damage.

A conventional MOS input/output (I/O) buffer transistor 110 and I/O pad 180 are shown in FIG. 1. Transistor 110 comprises a source 112, a drain 114 and a gate 116. The source and drain are regions of N-type conductivity formed in a substrate or well of P-type conductivity. The substrate or well, which is sometimes referred to as the body, is represented schematically in FIG. 1 by element 118. As shown in FIG. 1, source 112 and body 118 are connected to ground and drain 114 is connected to I/O pad 180. As will be appreciated by those skilled in the art, a typical integrated circuit has numerous such I/O pads and I/O buffers.

The circuit of FIG. 1 provides ESD protection by triggering a parasitic lateral bipolar transistor inherent in the MOS structure where the source and drain regions of the MOS transistor constitute the emitter and collector of the lateral bipolar transistor and the substrate constitutes the base. See, for example, A. Amerasekera and C. Durvery, *ESD in Silicon Integrated Circuits*, pp. 81-95, 137-148 (2d Ed., Wiley, 2002), which is incorporated herein by reference.

In the circuit of FIG. 1, P-type body 118 and N-type source region 112 form a first P-N junction and P-type body 118 and N-type drain region 114 form a second P-N junction. As a result, a parasitic lateral bipolar transistor is present in transistor 110 having a base-emitter junction that is the first P-N junction and a base-collector junction that is the second P-N junction. In the event of a positive voltage ESD event on the input pad, the second P-N junction is driven into breakdown and avalanche and the parasitic transistor is triggered into conduction to discharge the ESD pulse.

Unfortunately, the width of the parasitic bipolar transistor in some I/O buffers is too small to provide effective ESD protection. In addition, if an I/O buffer is used alone, it typically requires a salicide block mask or some kind of ballasting technique such as a back-end ballast (BEB). Such techniques also increase the size of the I/O buffer. To avoid the use of such techniques, it has been proposed to use a silicon controlled rectifier (SCR) in parallel with the I/O buffer. FIG. 2 illustrates such a circuit comprising an MOS I/O buffer transistor 110, an SCR 130, a resistor 160 and an I/O pad 180. Transistor 110 and I/O pad 180 are the same elements as in FIG. 1 and have been numbered the same. SCR 130 is connected between I/O pad 180 and ground. It comprises an NPN transistor 131 and a PNP transistor 141 each having an emitter 133, 143, a base 134, 144 and a collector 135, 145, respectively, connected so that the base of the NPN transistor is connected to the collector of the PNP transistor and the base of the PNP transistor is connected to the collector of the NPN transistor. Resistor 160 isolates SCR 130 from I/O buffer transistor 110. Unfortunately, for resistor 160 to be effective in isolating SCR 130 from I/O buffer 110, its resistance value must be 20 ohms or more. A resistance value this high significantly limits the speed of signals on the I/O pad.

SUMMARY OF THE PRESENT INVENTION

The present invention is the use of a sense circuit to detect an ESD event and turn on an SCR to discharge the ESD event. In a preferred embodiment, the circuit comprises a resistor in the signal path to/from an I/O buffer, a sense circuit in parallel with the resistor, an SCR connected between ground and a node between the resistor and the I/O pad and an I/O buffer connected between ground and the other end of the resistor. When the sense circuit detects a significant voltage drop across the resistor, it injects current into the SCR, thereby turning on the SCR and discharging the ESD event.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
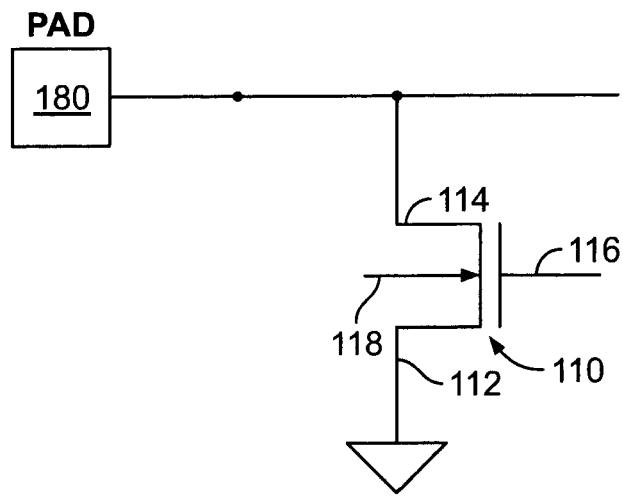
FIGS. 1 and 2 are schematic illustrations of prior art I/O buffer circuits.
Figure 2:
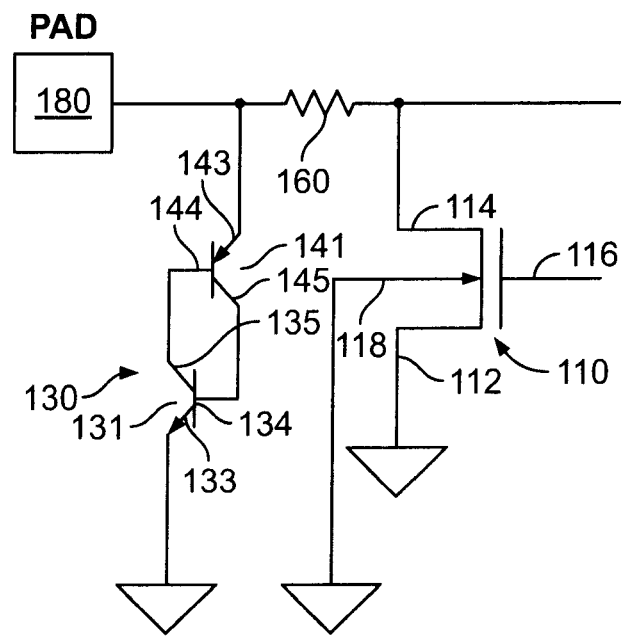
Figure 3:
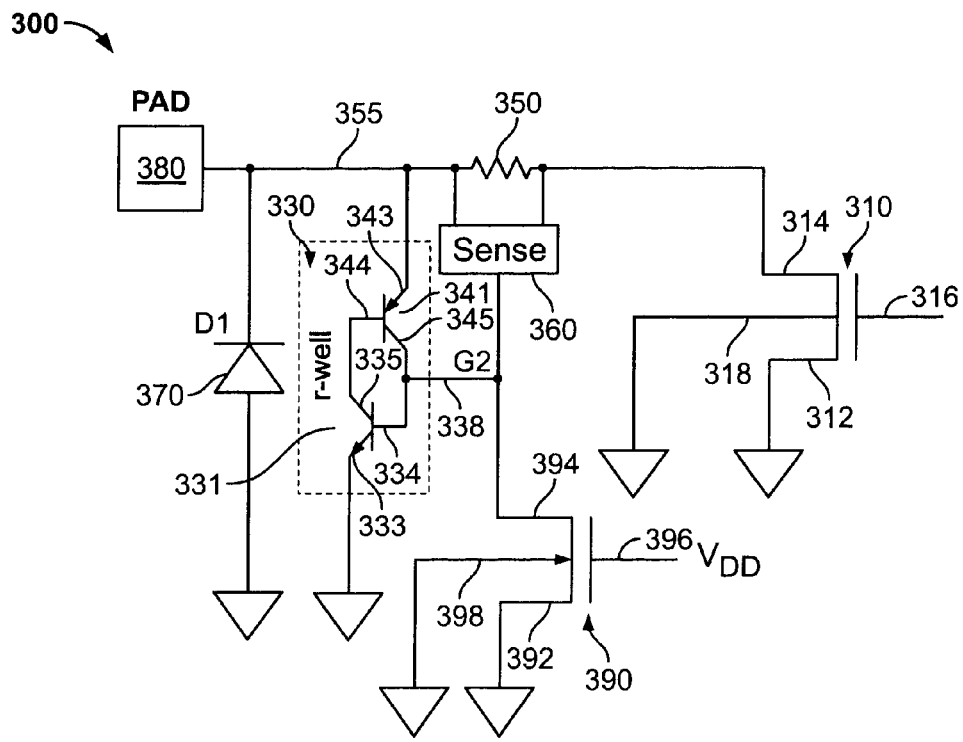
FIG. 3 is a schematic diagram of an illustrative embodiment of the present invention.

FIG. 3 is a schematic illustration of an ESD protection circuit 300 of the invention. Circuit 300 comprises an I/O buffer 310, an SCR 330, a sensing resistor 350, a sensor 360, a diode 370, an I/O pad 380 and an NMOS transistor 390.

I/O buffer 310 is an MOS transistor having a source 312, a drain 314 and a gate 316. Source 312 is connected to ground and drain 314 is connected to one end of resistor 350. In the case where the MOS transistor is an NMOS transistor, the source and drain are regions of N-type conductivity formed on a substrate or well of P-type conductivity. The substrate or well, both of which are frequently referred to as the body, is represented schematically in FIG. 3 by element 318. Body 318 is normally grounded as shown in FIG. 3.

SCR 330 comprises a NPN transistor 331 and a PNP transistor 341. The cathode of SCR 330 is connected to ground and the anode is connected to a lead 355 between resistor 350 and 110 pad 380. NPN transistor has an emitter 333, a base 334 and a collector 335. PNP transistor has an emitter 343, a base 344 and a collector 345. The base 334 of the NPN transistor is connected to the collector 345 of the PNP transistor; and the base 344 of the PNP transistor is connected to the collector 335 of the NPN transistor. SCR 330 is formed in an isolated P-well (designated R-well in FIGS. 3, 4 and 7) in a triple well technology. Emitter 333 is a first N-type region in the P-well, base 334 and collector 345 are the P-well, collector 335 and base 344 are an N-well in the P-well and emitter 343 is a P-type region formed in the N-well. SCR 330 may be triggered into conduction by applying a positive voltage signal to a triggering terminal 338 connected to the base 334 of the NPN transistor and collector 345 of the PNP transistor. As described above, base 334 and collector 345 are the P-well.

Sensing resistor 350 has a resistance value in the range from 2 to 8 ohms, more preferably in the range from 2 to 4 ohms and most preferably is about 2 ohms. It is connected between the anode of SCR 330 and the drain of I/O buffer 310. Sensing circuit 360 detects the voltage drop across resistor 350 caused by current flowing through the resistor. As will be evident, this current may be caused by a signal on lead 355 to/from I/O pad 380 or by an ESD event.

Diode 370 has an anode connected to ground and a cathode connected to lead 355. Diode 370 is present in circuit 300 to discharge negative electrostatic events. NMOS transistor 390 has a source 392 and drain 394 connected between ground and triggering terminal 338. A control voltage $V_{DD}$ is applied to a gate 396 of transistor 390. The control voltage can be a core voltage or an I/O voltage. The control voltage turns on NMOS transistor 390, thereby grounding triggering terminal 338 during normal operation.

Figure 4:
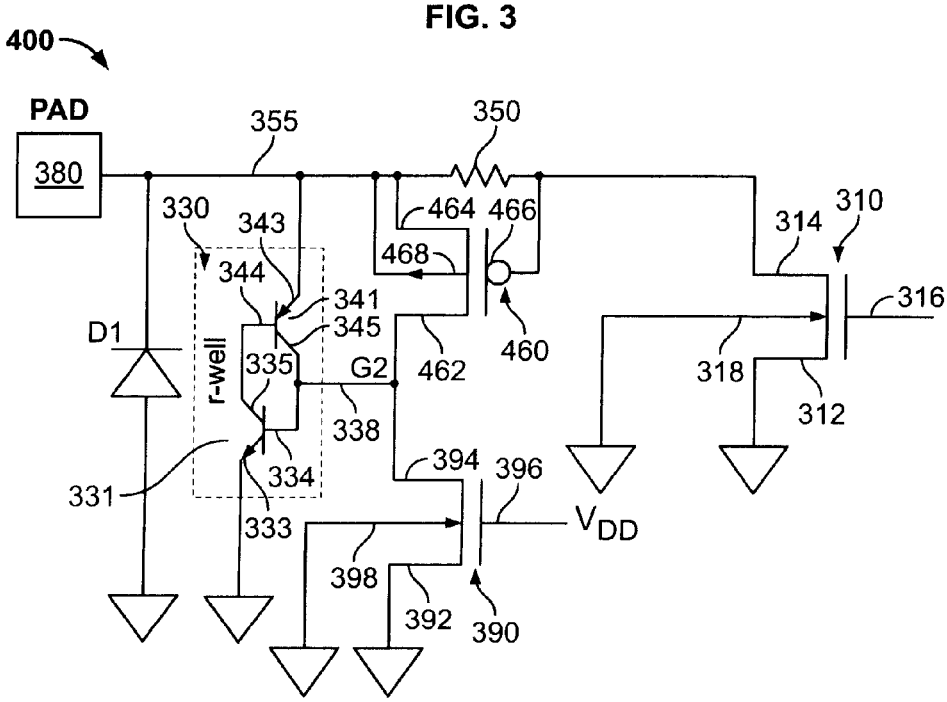
FIG. 4 is a schematic diagram of a specific implementation of the embodiment of FIG. 3.

FIG. 4 is a schematic illustration of a specific circuit embodiment 400 of the circuit of FIG. 3. Embodiment 400 comprises I/O buffer 310, SCR 330, sensing resistor 350, a PMOS transistor 460, diode 370, I/O pad 380 and NMOS transistor 390. PMOS transistor 460 has a source 462, a drain 464, a gate 466 and a body 468. Drain 464 is connected to the end of resistor 350 closer to I/O pad 380 and gate 466 is connected to the end of resistor 350 that is connected to I/O buffer 310. Source 462 is connected to triggering terminal 338 of SCR 330. Body 468 is connected to lead 355. The remaining elements of FIG. 4 are the same as those of FIG. 3 and bear the same identifying numerals.

Figure 7:
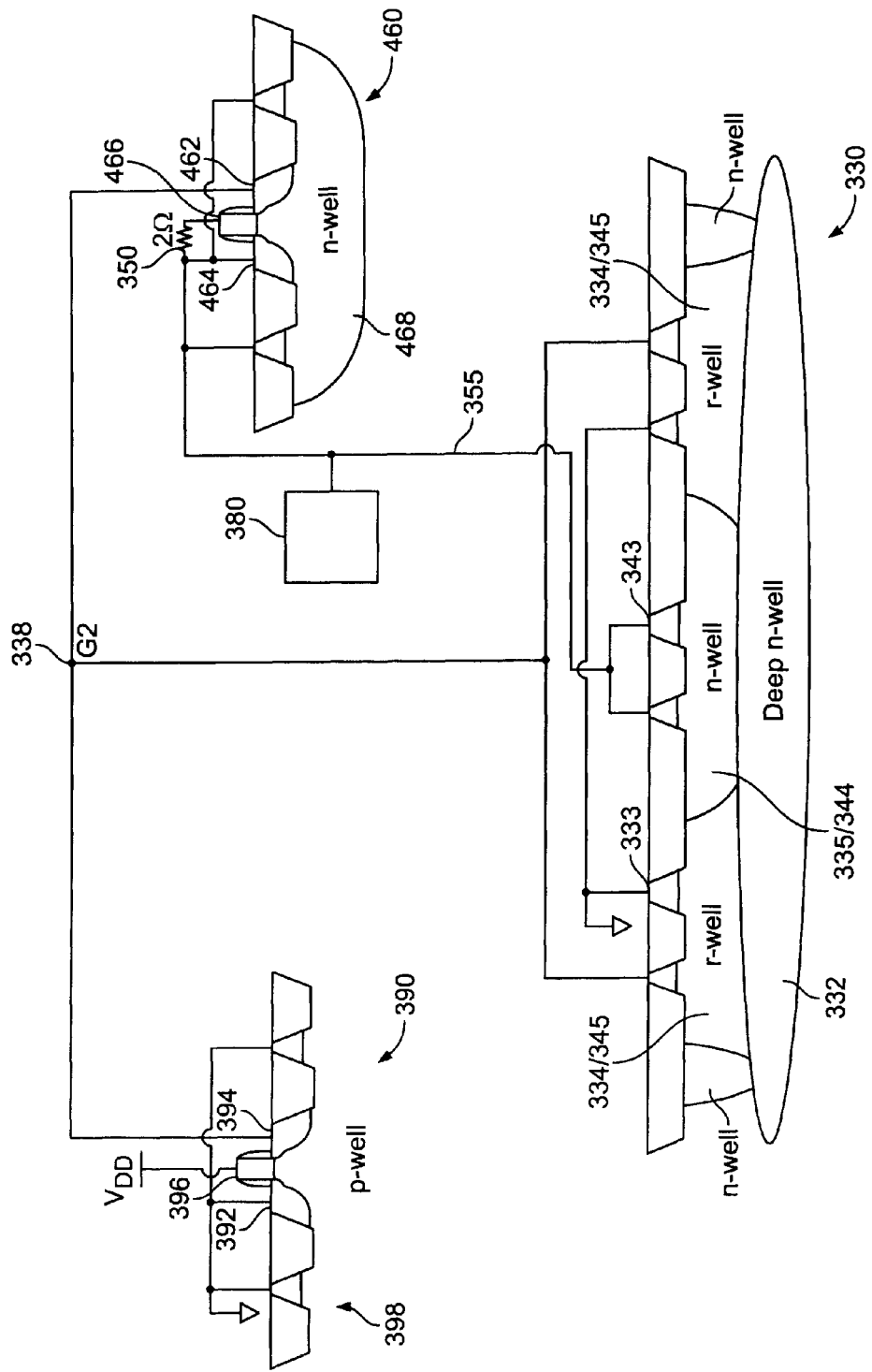
FIG. 7 is a cross-sectional view of some of the elements of FIG. 4.

FIG. 7 is an illustrative cross-sectional view of SCR 330, NMOS transistor 390 and PMOS transistor 460. As shown, SCR 330 comprises a deep N-well 332, a P-well (also designated an R-well) 334/345 formed in N-well 332, and an N-well 335/344 formed in P-well 334/345. SCR 330 further comprises an N-type region 333 in P-well 334/345 and a P-type region 343 in N-well 335/344. NMOS transistor 390 comprises source 392 and body 398, which are connected to ground, drain 394 which is connected to triggering terminal 338, and gate 396 which is connected to $V_{DD}$. PMOS transistor 460 comprises source 462 which is connected to triggering terminal 338, drain 464 and body 468, which are connected to lead 355, and gate 466 which is connected to sensing resistor 350.

NMOS transistor 310 (not shown in cross-section) has a cross-section similar to that of NMOS transistor 390 but drain 314 is connected to sensing resistor 350. Diode 370 (not shown in cross-section) comprises an N-type region formed in a P-well with the N-type region connected to lead 355 and the P-well to ground.

The operation of the circuit of FIG. 3 is as follows. During normal operation of the circuit, the current through sensing resistor 350 is relatively low. As a result the voltage drop across the sensing resistor is also low and sensing circuit 360 has no output. As a result, SCR 330 remains off.

In the event of a positive electrostatic event on I/O pad 380, the current through sensing resistor 350 becomes significant and produces a substantial voltage drop. As a result, sensing circuit 360 produces an output signal that turns on SCR 330 to discharge the electrostatic event.

In the event of a negative electrostatic event on I/O pad 380, diode 370 becomes forward biased and conducts to discharge the electrostatic event.

In FIG. 4, the voltage drop across sensing resistor 350 is detected across the gate-drain P-N junction of PMOS transistor 460. During normal operation, this voltage drop is minis-cule and does not turn on transistor 460. In the event of a positive electrostatic event, however, this voltage drop is sufficient to turn on transistor 460 thereby applying a signal to SCR 330 that is sufficient to turn on the SCR and discharge the electrostatic event.

Figure 5A:
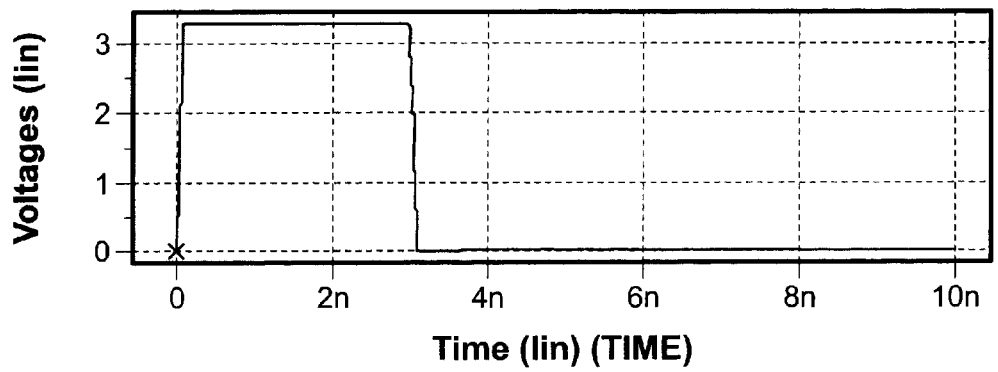
FIGS. 5A-5C are plots of signal waveforms for a SPICE simulation of typical signal transients in the circuit of FIG. 4.
Figure 5B:
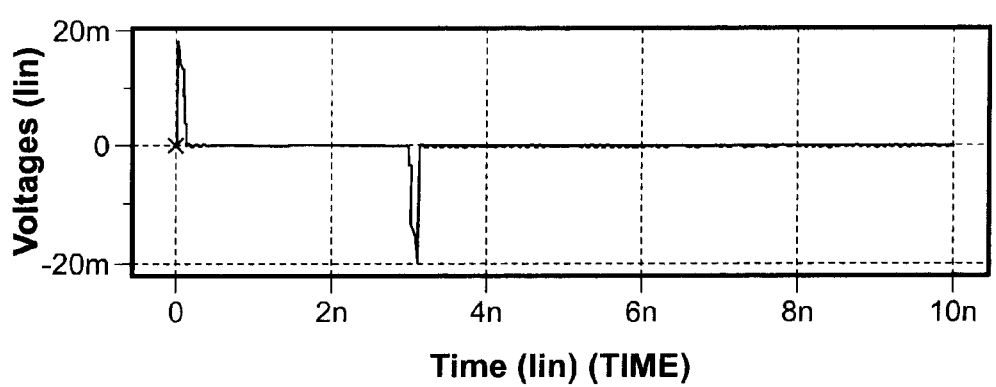
Figure 5C:
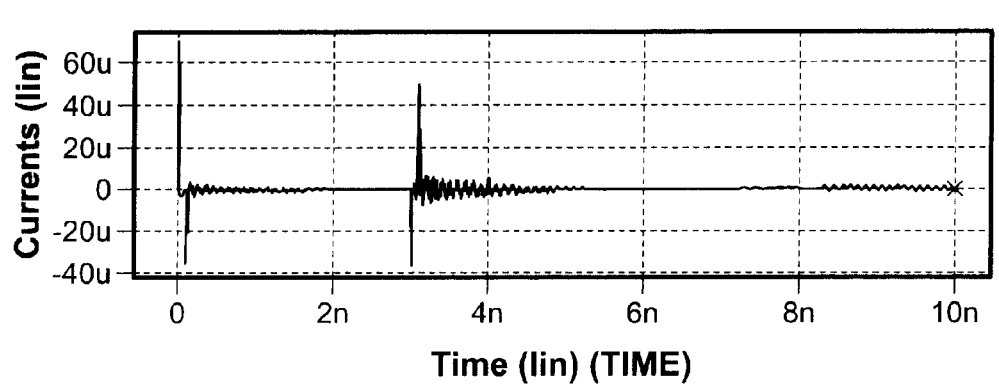

FIGS. 5A-5C are plots of signal waveforms for a SPICE simulation of typical signal transients in the circuit of FIG. 4. The horizontal axis is time in nanoseconds. FIG. 5A depicts a rectangular input pulse of slightly more than 3 Volts in magnitude that is applied to I/O pad 380. FIG. 5B depicts the resulting voltage signal at triggering terminal 338; and FIG. 5C depicts the current through PMOS transistor 460. As will be apparent, the peak voltage signal is approximately +/−20 milliVolts; and the peak current is approximately +60 microAmps. These levels are not enough to trigger SCR 330.

Figure 6:
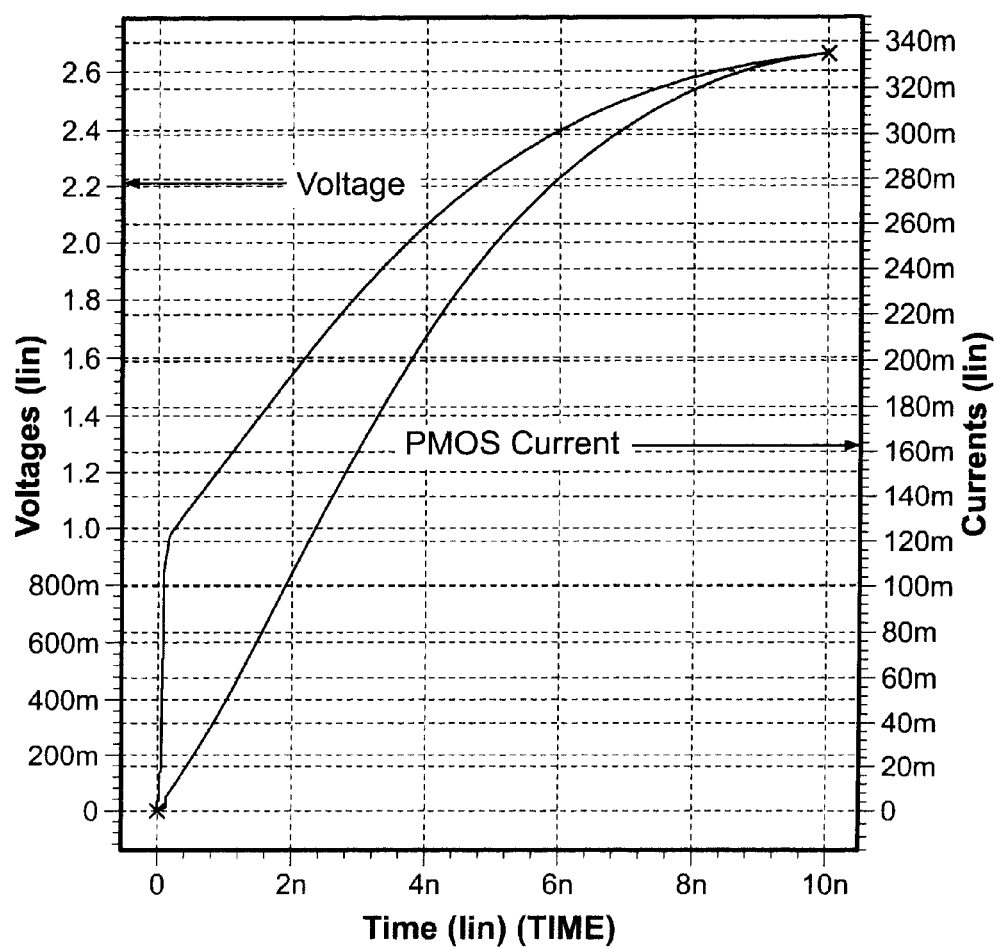
FIG. 6 is a plot of voltage waveforms for a SPICE simulation of an ESD event in the circuit of FIG. 4.

FIG. 6 is a plot of signal waveforms for a SPICE simulation of a 2 kilo Volt human body model (HBM) electrostatic discharge. Again, the horizontal axis is time in nanoseconds. The waveform on the left is the voltage (in Volts) at triggering terminal 338; and the waveform on the right is the current through PMOS transistor 460. As will be apparent, the voltage at terminal 338 rises substantially instantaneously to about 1 volt and the current rises to more than 40 milliAmps in less than 1 nanosecond. These levels are sufficient to trigger SCR 330. The simulation results following triggering are not believed to be accurate due to limitations of the model in handling high voltage/high current regimes.

The circuit of FIGS. 3 and 4 has the advantage that no BEB resistance is required to distribute current uniformly across the I/O buffer. As a result, the layout size required for the buffer is much smaller than for a buffer with a BEB resistance and the size of the buffer+SCR+triggering circuitry shown in FIG. 4 is roughly equivalent to the size of a conventional 250 micron wide BEB buffer circuit.

As will be apparent to those skilled in the art, numerous variations may be made within the spirit and scope of the invention.

What is claimed is:

1. An input/output (I/O) circuit with electrostatic discharge (ESD) protection comprising:
   an I/O pad;
   a resistor having first and second ends, the first end being connected to the I/O pad;
   an I/O buffer connected between the second end of the resistor and ground;
   a sensor circuit for sensing a voltage drop across the resistor;
   a silicon controlled rectifier (SCR) connected between the first end of the resistor and ground and having a trigger terminal connected to an output of the sensor circuit; and
   a switch connected between ground and the trigger terminal for grounding the trigger terminal during normal operation of the circuit.

2. The circuit of claim 1 wherein the resistor has a resistance in the range from approximately 2 Ohms to approximately 8 Ohms.

3. The circuit of claim 1 wherein the resistor has a resistance in the range from approximately 2 Ohms to approximately 4 Ohms.

4. The circuit of claim 1 wherein the resistor has a resistance of approximately 2 ohms.

5. The circuit of claim 1 wherein the sensor circuit is a transistor.

6. The circuit of claim 1 wherein the sensor circuit is a PMOS transistor.

7. The circuit of claim 1 wherein the sensor circuit is a PMOS transistor having a gate connected to the second end of the resistor and a source and a drain connected between the first end of the resistor and the trigger terminal of the SCR.

8. The circuit of claim 1 wherein the switch is a MOS transistor having a source and a drain connected between ground and the trigger terminal.

9. An electrostatic discharge (ESD) protection circuit comprising:
- a resistor having first and second ends, the first end being connected to an I/O pad;
- an I/O buffer connected between the second end of the resistor and ground;
- a sensor circuit for sensing a voltage drop across the resistor;
- a silicon controlled rectifier (SCR) connected between the first end of the resistor and ground and having a trigger terminal connected to an output of the sensor circuit; and
- a switch connected between ground and the trigger terminal for grounding the trigger terminal during normal operation of the circuit.

10. The circuit of claim 9 wherein the resistor has a resistance in the range from approximately 2 Ohms to approximately 8 Ohms.

11. The circuit of claim 9 wherein the resistor has a resistance in the range from approximately 2 Ohms to approximately 4 Ohms.

12. The circuit of claim 9 wherein the resistor has a resistance of approximately 2 ohms.

13. The circuit of claim 9 wherein the sensor circuit is a transistor.

14. The circuit of claim 9 wherein the sensor circuit is a PMOS transistor.

15. The circuit of claim 9 wherein the sensor circuit is a PMOS transistor having a gate connected to the second end of the resistor and a source and a drain connected between the first end of the resistor and the trigger terminal of the SCR.

16. The circuit of claim 9 wherein the switch is a MOS transistor having a source and a drain connected between ground and the trigger terminal.

17. In an input/output (I/O) circuit, a method of protecting against electrostatic discharge comprising the steps of:
- connecting a silicon controlled rectifier (SCR) between an I/O pad and ground;
- connecting a resistor and an I/O buffer in series between the I/O pad and ground;
- sensing a voltage drop across the resistor;
- triggering the SCR in response to the sensed voltage drop; and
- connecting a switch between a trigger terminal of the SCR and ground for grounding the trigger terminal during normal operation of the circuit.

18. The method of claim 17 wherein the resistor has a resistance in the range from approximately 2 Ohms to approximately 8 Ohms.

* * * * *